(12) United States Patent
Huynh et al.

(10) Patent No.: US 11,980,004 B1
(45) Date of Patent: May 7, 2024

(54) DOUBLE SIDED CABLE GUIDE

(71) Applicant: Amazon Technologies, Inc., Seattle, WA (US)

(72) Inventors: Kenny Kiet Huynh, Lynnwood, WA (US); Roey Rivnay, Sammamish, WA (US); Timothy Allan Pizzino, Seattle, WA (US); Gregory Martin Albright, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/849,152

(22) Filed: Jun. 24, 2022

(51) Int. Cl.
*H05K 7/14* (2006.01)

(52) U.S. Cl.
CPC .................................. *H05K 7/1491* (2013.01)

(58) Field of Classification Search
CPC .. H05K 5/0247; H05K 7/1447; H05K 7/1448; H05K 7/1449; H05K 7/1491; H05K 7/1451; H05K 7/1492; H05K 7/1487; F16G 13/16; G06F 1/187
See application file for complete search history.

(56) References Cited

U.S. PATENT DOCUMENTS

| | | | | |
|---|---|---|---|---|
| 3,448,954 A | * | 6/1969 | Kurlandsky | F16G 13/16 248/51 |
| 4,669,507 A | * | 6/1987 | Moritz | F16G 13/16 174/101 |
| 5,649,415 A | * | 7/1997 | Pea | F16G 13/16 248/51 |
| 6,621,692 B1 | * | 9/2003 | Johnson | H05K 7/1421 361/679.55 |
| 6,996,967 B2 | * | 2/2006 | Kobayashi | E05F 15/646 59/900 |
| 7,984,605 B2 | * | 7/2011 | Pfeifer | F16G 13/16 174/72 A |
| 8,335,076 B2 | * | 12/2012 | Zhang | G06F 1/184 174/559 |
| 8,379,410 B2 | * | 2/2013 | Kitten | H05K 7/1491 361/825 |
| 8,599,550 B2 | * | 12/2013 | Davis | G11B 33/128 361/679.33 |
| 9,001,514 B2 | * | 4/2015 | Rust | H05K 7/02 361/727 |
| 9,070,419 B1 | * | 6/2015 | Zhu | G11B 33/128 |
| 9,370,121 B2 | * | 6/2016 | Chen | H05K 7/1489 |

(Continued)

*Primary Examiner* — Patrick D Hawn
(74) *Attorney, Agent, or Firm* — Kilpatrick Townsend & Stockton LLP

(57) ABSTRACT

A cable guide can include a first bracket and a second bracket. The first bracket can be configured to be coupled with a reference body The second bracket can be configured to be coupled with a moveable body moveable relative to the reference body. For example, the moveable body may correspond to a slidable server or other appliance receivable in a rack, and the reference body may correspond to a tray in the rack. A conduit structure may extend between the first bracket and the second bracket and include a first conduit laterally joined along a juncture to a second conduit. The first conduit and the second conduit may be separately serviceable. For example, the first conduit and the second conduit may be at least one of releasably separable along the juncture or separately openable along opposite sidewalls of the conduit structure.

11 Claims, 6 Drawing Sheets

(56) References Cited

U.S. PATENT DOCUMENTS

| | | | | |
|---|---|---|---|---|
| 10,133,302 B2* | 11/2018 | Yuan | ................. | G06F 1/182 |
| 10,165,703 B1* | 12/2018 | Adrian | ................. | H05K 7/1491 |
| 10,299,401 B2* | 5/2019 | Chen | ................. | F16L 3/015 |
| 10,843,347 B1* | 11/2020 | Murphy | ................. | B25J 15/0616 |
| 10,945,349 B2* | 3/2021 | Wang | ................. | H05K 7/1487 |
| 2010/0072869 A1* | 3/2010 | Hsu | ................. | F16G 13/16 |
| | | | | 312/348.3 |
| 2010/0123377 A1* | 5/2010 | Hsu | ................. | H05K 7/1491 |
| | | | | 312/330.1 |
| 2012/0134095 A1* | 5/2012 | Zhang | ................. | G06F 1/181 |
| | | | | 361/679.02 |
| 2013/0120927 A1* | 5/2013 | Wen | ................. | G11B 33/126 |
| | | | | 361/679.01 |
| 2014/0204525 A1* | 7/2014 | Pecone | ................. | H05K 7/02 |
| | | | | 361/679.33 |
| 2014/0293523 A1* | 10/2014 | Jau | ................. | H05K 7/1487 |
| | | | | 361/679.4 |
| 2018/0063987 A1* | 3/2018 | Chen | ................. | H02G 11/006 |

* cited by examiner

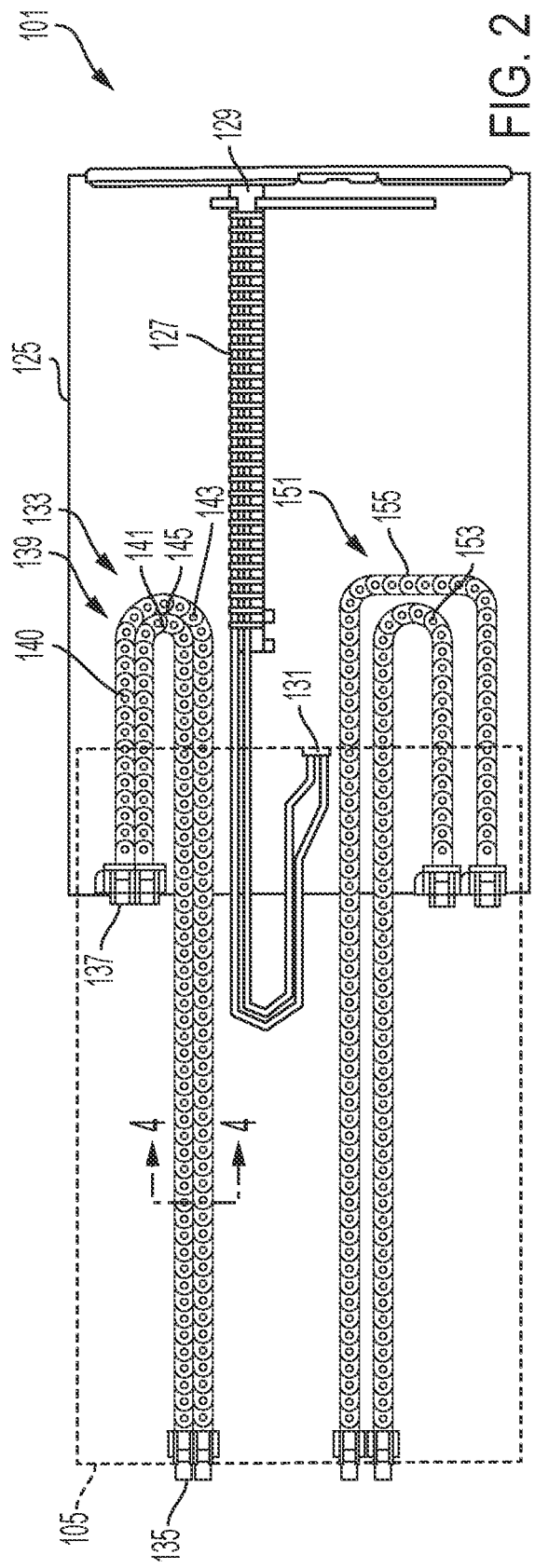

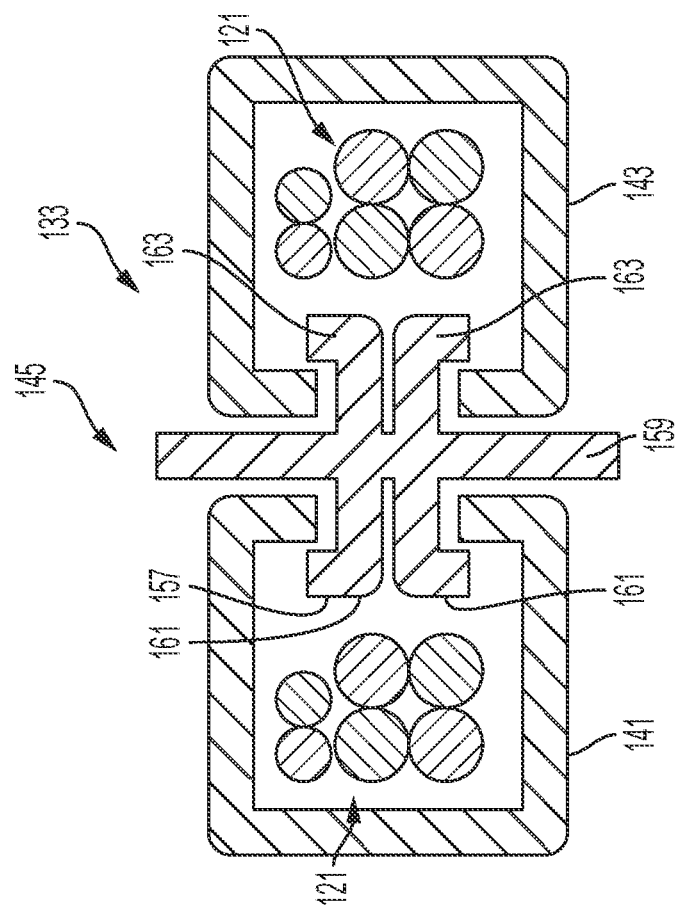

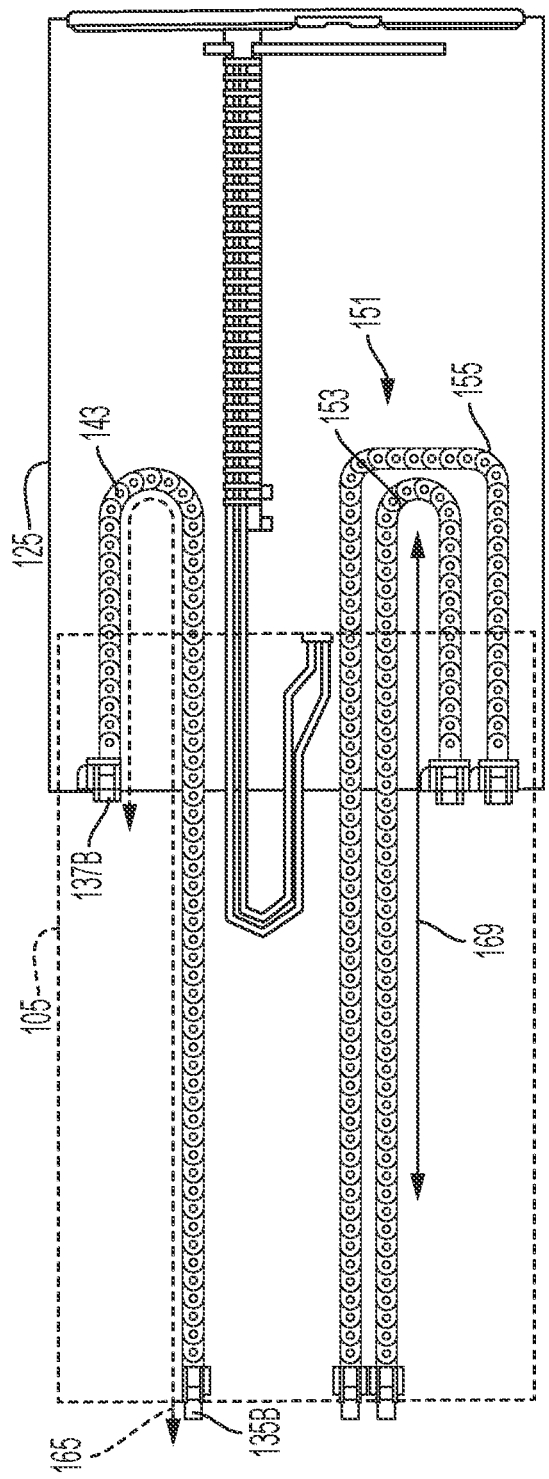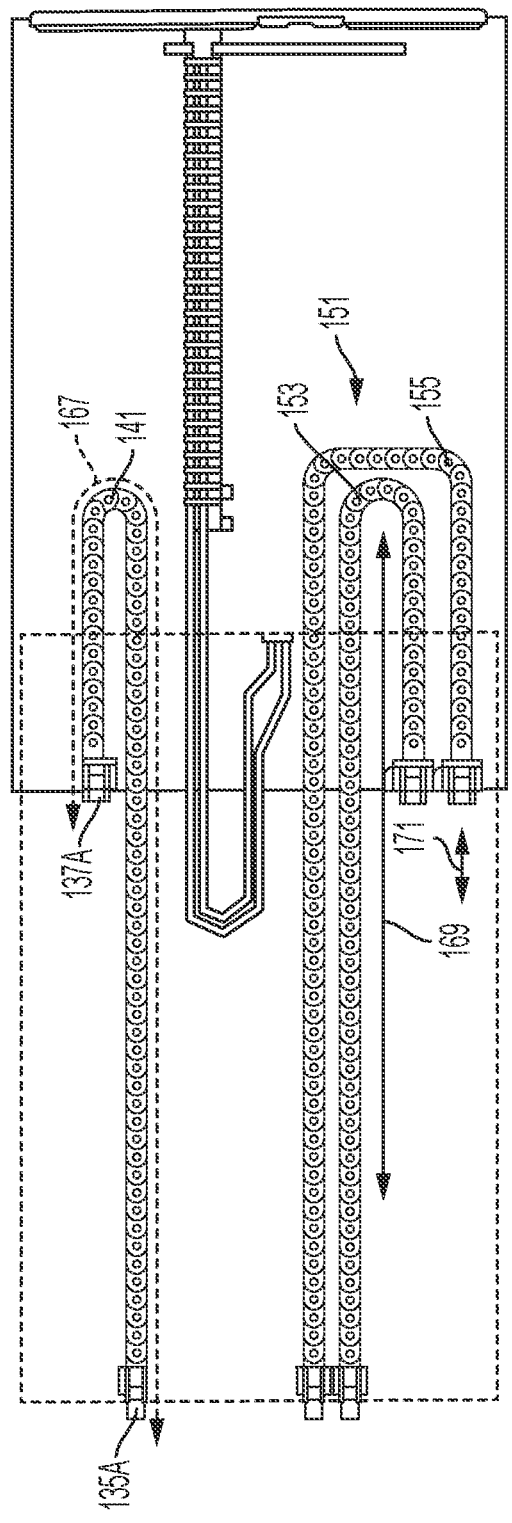

DOUBLE SIDED CABLE GUIDE

BACKGROUND

Datacenters typically house collections of servers and networking hardware, which can include switches and routers. Often many different cabled connections are used to connect components within a datacenter. As a number of cabled connections often reaches a non-trivial level, systems and techniques for managing cabling can be a relevant consideration in efforts to limit the cost of operating a datacenter and/or to maintain availability of datacenter computing resources.

BRIEF DESCRIPTION OF THE DRAWINGS

Various embodiments in accordance with the present disclosure will be described with reference to the drawings, in which:

FIG. 2 is a top view of an example of an extended state of an appliance that may be implemented in the system of FIG. 1 in accordance with various embodiments;

FIG. 3 is a top view of an example of a retracted state of an appliance that may be implemented in the system of FIG. 1 in accordance with various embodiments;

FIG. 4 is an end view of an example of a track structure that may be included in the cable guide of FIGS. 2-3 in accordance with various embodiments;

FIG. 5 is a top view of an example of a state in which a first conduit has been removed from the cable guide of FIGS. 2-3 for separate servicing from a second conduit in accordance with various embodiments;

FIG. 6 is a top view of an example of a state in which the second conduit has been removed from the cable guide of FIGS. 2-3 for separate servicing from the first conduit in accordance with various embodiments;

DETAILED DESCRIPTION

Figure 1:
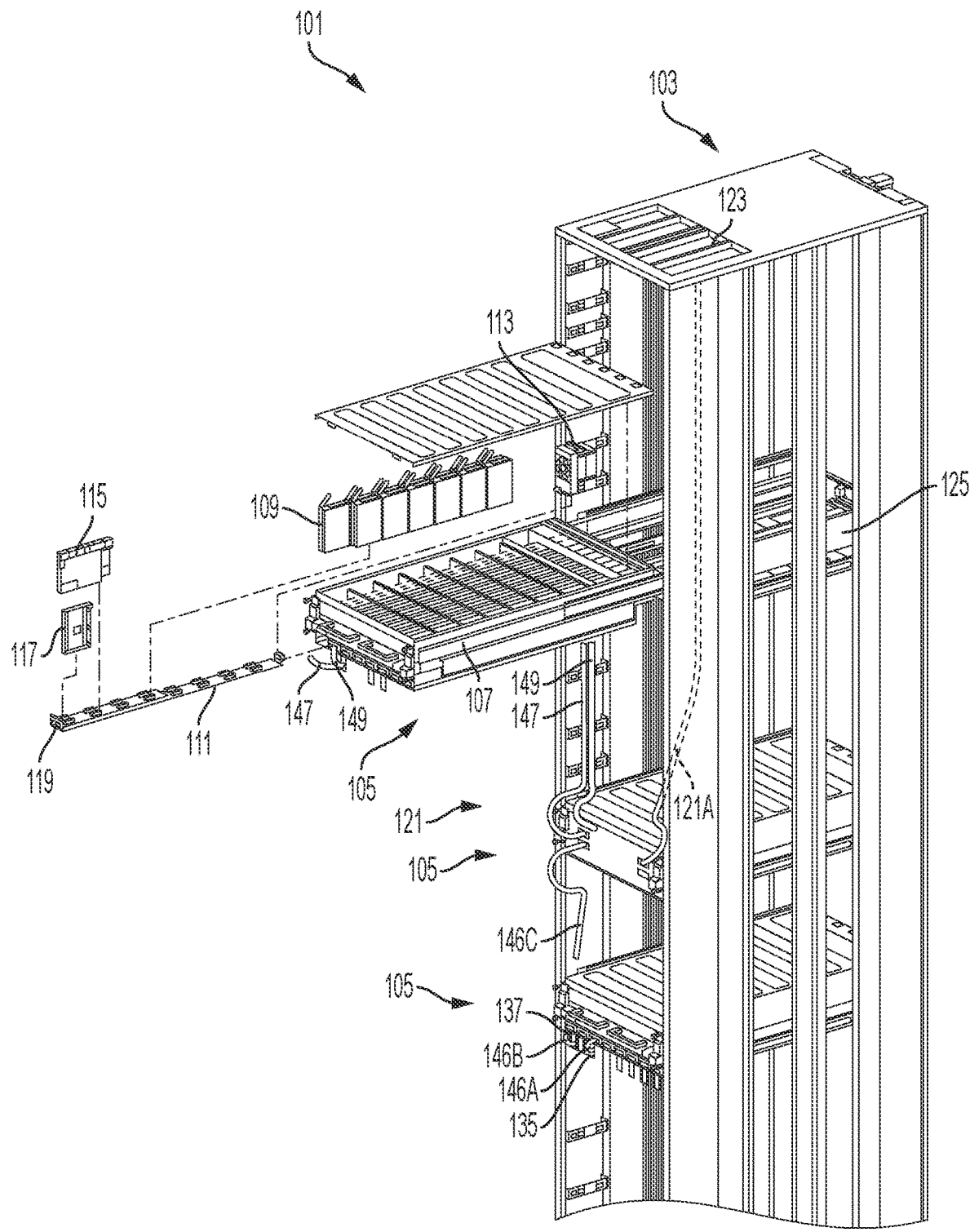
FIG. 1 is a front perspective view of an example of a system in which slidable appliances may be implemented in accordance with various embodiments.

Embodiments herein are directed to connection structures and associated components for computing equipment, such as may be used in computer networks for datacenters or other locations. The connection structures can include cable guides that can be installed relative to racks bearing appliances such as computer servers, networking hardware components, or other computing devices.

The cable guides can be chains or other structures that may bend or shift among different shapes. Opposite ends of the cable guide may include brackets for mounting to other parts. For example, one bracket may attach one end of the cable guide to a slidable server chassis, while another bracket may attach an opposite end to a rack-mounted tray underneath or below the slidable server chassis. The cable guide may rest on and/or be supported by the rack-mounted tray, for example. The cable guide may exhibit a U-shape extending between the brackets. In use, as the slidable server chassis is pulled out of the rack, a bend of the U-shape may shift position. For example, this change in bend location may occur as the chassis-anchored side of the U-shape lengthens to travel with the chassis. At the same time, the tray may remain fixed and cause the tray-anchored side of the U-shape to shorten in response to the chassis movement, e.g., such that the cable guide changes to resemble a J-shape instead of a U-shape.

Each cable guide can include multiple conduits that extend along the length of the cable guide (e.g., along the U-shape/J-shape in use). For example, the cable guide may be double-sided, e.g., with a first conduit and a second conduit that may be laterally joined along a juncture. In such an arrangement, the conduits may run alongside each other. In use, the first conduit may be arranged as an inner loop, while the second conduit may be arranged as an outer loop adjacent to and abutting the inner loop. Separate cables may be routed through each of the inner loop and the outer loop. The conduits of the cable guide may be separately serviceable such that a cable in one conduit can be accessed for servicing without requiring unplugging or other disruption of connection relative to a cable in the other conduit. For example, in some arrangements, the juncture may include a track along which the inner conduit can be pulled to slide out of engagement from the cable guide while leaving the outer conduit in place (or vice versa). A target cable may be serviced within the extracted conduit, after which that separate conduit may be slid back onto the track of the juncture to feed the removed conduit back into place without disrupting the placement and connection of the other conduit of the cable guide. Additionally or alternatively, in some arrangements, the cable guide can include inwardly-facing sidewalls (e.g., openable to provide access to the inner loop) and outwardly-facing sidewalls (e.g., openable to provide access to the outer loop). Arranging the conduits of the cable guide to be separately serviceable may allow "hot swapping" or other operations in which it may be beneficial to maintain one connection while another connection is interrupted for servicing.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, FIG. 1 depicts an assembly or a system 101. The system 101 can include a rack 103. The rack 103 can include any suitable structure for supporting other components of the system 101. For example, metal or other suitably load-bearing material may be implemented in columns, beams, panels, or other suitable structures. Structure of the rack 103 can be coupled by bolts, screws, or any other suitable fasteners or fastening technique (including, but not limited to, welding, adhesives, or mechanical fasteners).

The system 101 can include appliances 105. The appliances 105 may be slidingly received in the rack 103. For example, the appliances 105 may be mounted on rails 107 or other suitable structure that may support the appliance 105 and permit movement of the appliance between an extended position (e.g., such as shown for the topmost appliance 105 in FIG. 1) and a retracted position in which the appliance 105 is received within the rack 103 (e.g., such as shown for the lowermost appliance 105 in FIG. 1). In the extended position, the appliance 105 may be arranged at least partially protruding from the rack 103, while in the retracted position, the appliance 105 may be arranged at least partially received within a volume defined by the rack 103. For example, in the extended position, features of the appliance 105 may be accessible for servicing in use.

The appliances 105 can include computer servers, network hard drive components, network switches, or other network hardware components or other appliances for a data center or other environment. As an illustrative example, the uppermost appliance 105 in FIG. 1 is depicted as a computer server having hard disk drives (HDD), solid state drives (SDD) or other storage devices 109 mountable on a back plane 111 along with other supporting components such as a fan 113, a network card 115, and a base management controller with a processor for monitoring physical states of components of the appliance 105, although any other combination of resources and/or components may be utilized in the appliances 105. Although a particular number of storage devices 109 and back planes 111 are represented in FIG. 1, any number of one or more may be utilized.

The appliances 105 can include suitable interfaces or ports 119 for communicatively coupling through cabling 121 with other parts of the system 101. In FIG. 1, the uppermost appliance 105 is depicted with a port 119 provided on the back plane 111, although any other suitable location on the appliance 105 and/or interface for coupling may be utilized to facilitate connectivity. The ports 119 can include any suitable form factor and may differ from or be alike to one another. The ports 119 may correspond to any suitable form factor of pluggable module, pluggable media, pluggable transceiver, or other pluggable component. For example, the ports 119 may be sized and arranged to meet any suitable standard for pluggable optical transceivers. In one non-limiting example, one or more of the ports 119 may correspond to a small form-factor pluggable (SFP) transceiver, such as is commonly used for telecommunication and/or data communications applications. In another non-limiting example, one or more of the ports 119 comprises an enhanced small form-factor pluggable (SFP+) transceiver or a compact small form-factor pluggable (CSFP) transceiver. In an additional non-limiting example, one or more of the ports 119 comprises an RJ45 connector or a similar connector. Further non-limiting examples may include QSFP, QSFP+, QSFP28, QSFP56, QSFP56-DD, OSFP, or other standards that may be known in the art.

As another example, the appliance 105 depicted in the middle of the rack 103 in FIG. 1 may correspond to a network switch or other suitable structure with which other appliances 105 may communicate. The cabling 121 may include a set of cabling 121A that can provide communication to an exit interface 123 or other suitable structure for providing data communication to other components outside of the rack 103.

The system 101 can include trays 125. The trays 125 may be situated underneath, below, or at another suitable position relative to appliances 105. The trays 125 may include and/or support suitable structures for managing portions of the cabling 121. Some illustrative examples of such structures are described with respect to FIGS. 2 and 3 for example.

FIGS. 2 and 3 illustrate a top view of a tray 125 adjacent to an appliance 105. In FIG. 2, the appliance 105 is in an extended position, and in FIG. 3 the appliance is in a retracted position. The appliance 105 is shown in dashed lines to represent an outline of the appliance 105 so as not to obscure the view of other components.

The tray 125 can support structures that may facilitate maintaining connection between moving parts during extension and/or retraction of the appliance 105. As one example, the tray 125 may support a power chain 127. The power chain 127 may provide connection to a power supply interface 129 and may include suitable wiring or other conductors to provide power to a power coupler 131 of the appliance 105. The power chain 127 may be flexible and able to bend so that the power connection can be maintained regardless of whether the appliance 105 is in an extended or a retracted position.

The system 101 can include a cable guide 133. The cable guide 133 may include at least some structure similar to the power chain 127. The cable guide 133 may facilitate maintaining connection of cables (such as cabling 121) during extension and/or retraction of the appliance 105 relative to the tray 125. Moreover, although description herein may primarily refer to implementation relative to the appliance 105 and the tray 125, implementation may be relative to any other form of reference body (e.g., in lieu of the tray 125) or moveable body (e.g., in lieu of the appliance 105 and/or that may be moveable relative to the reference body).

The cable guide 133 can include a first bracket 135 and a second bracket 137. The first bracket 135 and the second bracket 137 can be located at opposite ends of the cable guide 133, for example.

The first bracket 135 may correspond to a server bracket or may otherwise be configured to be coupled with the appliance 105 (or other chassis or moveable body). The first bracket 135 may be coupled with an underside of the appliance 105, such as at a front of the appliance 105, for example.

The second bracket 137 may correspond to a tray bracket or may otherwise be configured to be coupled with the tray 125 (or other reference body). The second bracket 137 may be coupled with a top side of the tray 125, such as at a front of the tray 125, for example.

The first bracket 135 and/or the second bracket 137 may include suitable structure for mounting and for facilitating connection of cabling 121 among other components of the system 101. For example, the first bracket 135 and/or the second bracket 137 may include suitable connectors and/or passages for receiving the cabling 121. Additionally or alternatively, cabling 121 may be routed to, through, over, or in any other suitable manner relative to the first bracket 135 and/or the second bracket 137.

The cable guide 133 can define a conduit structure 139 that may extend between the first bracket 135 and the second bracket 137. The conduit structure 139 may be formed by a series of links 140. The links 140 may be movable in response to movement of the appliance 105, for example. The links 140 may form a chain such that the cable guide 133 may correspond to a cable chain, although tubes or any other suitable structure for defining other noted features or structures of the cable guide 133 may be utilized.

The cable guide 133 may be double-sided. The conduit structure 139 can include a first conduit 141 and a second conduit 143. The first conduit 141 and the second conduit 143 can be joined along a juncture 145. For example, the first conduit 141 and the second conduit 143 can be laterally joined along the juncture 145. Laterally joining along the juncture 145 may allow the first conduit 141 and the second conduit 143 to extend along one another, e.g., along a length of the cable guide 133. The first conduit 141 and the second conduit 143 may be partitioned from each other by the juncture 145, for example.

The first conduit 141 and the second conduit 143 can be coupled together so that the first conduit 141 is arranged as an inner loop and so that the second conduit 143 is arranged as an outer loop. The conduit structure 139 may be arranged to extend in a U-shape between the first bracket 135 and the second bracket 137. For example, the conduit structure 139 may be doubled back upon its length or may be otherwise at least partially bent and/or looped along its length. Respective lengths of sides of the U-shape may change during extension and retraction of the appliance 105 relative to the tray 125. For example, as may be appreciated by comparing FIG. 3 with FIG. 2, during extension, the U-shape may lengthen along one side coupled with the first bracket 135 (e.g., traveling with the appliance 105) and may shorten along an opposite side coupled with the second bracket 137 (e.g., remaining fixed with the tray 125). Lengthening and shortening may reverse during retraction. The shortening and lengthening of the respective sides of the U-shape may correspond to the U-shape shifting to a J-shape appearance, although the J-shape may correspond to a subset of U-shape possibilities.

The first conduit 141 and the second conduit 143 may be separately serviceable in use. For example, the first conduit 141 and the second conduit 143 may be releasably separable along the juncture and/or openable separately from one another. The first conduit 141 and the second conduit 143 being separately serviceable may allow for separate removal, servicing, replacement, and/or installation of portions of cabling 121 and/or other components. Features of the conduit structure 139 may facilitate the separate serviceability of the first conduit 141 and the second conduit 143. Examples of such features are described with respect to subsequent figures herein.

The cable guide 133 may be arranged for routing therethrough of portions of the cabling 121 (e.g., FIG. 1). As an illustrative example with reference to the lowermost appliance in FIG. 1, the cabling 121 may include a first segment 146A that is plugged into the front of the appliance 105 and routed to the first bracket 135. Routing to the first bracket 135 may facilitate passage through the cable guide 133 shown in FIG. 2. For example, referring further to FIG. 2, the routing may involve entering through or over the first bracket 135, traveling through the conduit structure 139, and exiting through or over the second bracket 137. Turning again to FIG. 1, upon exiting the second bracket 137 the routing may continue in another segment 146B that may be suitably routed along the rack 103 for continuing into and/or connection with a further segment 146C that can provide connection to a switch or other appliance 105 (such as the appliance 105 depicted in the middle of the rack 103 in FIG. 1).

The cable guide 133 may also be arranged for handling multiple parts of the cabling 121 through different parts of the cable guide 133. As an illustrative example with reference to the uppermost appliance in FIG. 1, the cabling 121 may include a first cable 147 and a second cable 149. The first cable 147 and the second cable 149 may follow a similar overall routing described above with respect to the lowermost appliance 105 (e.g., arranged plugged into a front of the server or appliance 105 (FIG. 1), extending through the cable guide 133 (FIG. 2), and extending from there to connect with a switch or other appliance 105 (FIG. 1)). The first cable 147 and the second cable 149 may extend through different portions of the cable guide 133, however. For example, the first cable 147 (FIG. 1) may extend through the inner loop/first conduit 141 (FIG. 2) without extending through the outer loop/second conduit 143 (FIG. 2), and the second cable 149 (FIG. 1) may extend through the outer loop/second conduit 143 (FIG. 2) without extending through the inner loop/first conduit 141 (FIG. 2). With further reference to FIG. 1, the first cable 147 can be communicatively coupled with a first storage device 109 while the second cable can be communicatively coupled with a second storage device 109 such as by plugging into different ports 119 of an individual back plane 111 or different back planes of the appliance 105. As a result of the first conduit 141 and the second conduit 143 being separately serviceable, the cable guide 133 may provide access to the first cable 147 without disrupting communication of the second cable 149 with a second storage device 109 and/or may provide access to the second cable 149 without disrupting communication of the first cable 147 with the first storage device 109. The cable guide 133 may be selectively switchable between modes for these functions, for example.

For purposes of comparison, the tray 125 in FIGS. 2 and 3 is also shown with a nested arrangement 151. The nested arrangement 151 can include an inwardly nested keeper 153 and an outwardly nested keeper 155. The inwardly nested keeper 153 and the outwardly nested keeper 155 may be installed without being coupled together along their lengths. In various aspects, the inwardly nested keeper 153 and the outwardly nested keeper 155 may each include a respective passage for receiving therethrough one or more cables of the cabling 121 or may otherwise include some similar structures to the cable guide 133. In various examples, the nested arrangement 151 may be suitable for replacement by the cable guide 133. Such replacement may be beneficial because in use, the nested arrangement 151 may be subject to a risk of the inwardly nested keeper 153 deflecting in a different shape than the outwardly nested keeper 155 during movement of the appliance 105 relative to the tray 125. Thus, the inwardly nested keeper 153 and the outwardly nested keeper 155 may be subject to binding or other interference with one another in a manner that may be avoided by use of the cable guide 133 in which the first conduit 141 and the second conduit 143 are joined along a juncture 145 that may prevent disparate shapes from occurring during movement.

FIG. 4 is an end view showing an example of structure that may be included in the cable guide 133. FIG. 4 may correspond to a view taken along the line 4-4 in FIG. 2, for example. The cable guide 133 at the juncture 145 can include a track 157 along which at least one of the first conduit 141 or the second conduit 143 is slidable. The track 157 may be supported by a base 159 that may form a partition or other portion of structure of the juncture 145, for example.

The track 157 may be formed to include an inner portion 161 of the track 157 and an outer portion 163 of the track 157. The inner portion 161 of the track 157 may correspond to a suitable surface along which the first conduit 141 is slidable. The outer portion 163 of the track 157 may correspond to a suitable surface along which the second conduit 143 is slidable. In operation, the track 157 may facilitate sliding in a direction that is into or out of the page in FIG. 4, for example.

FIG. 4 also depicts an example of cabling 121 in which multiple cables are arranged extending through the respective first conduit 141 and the second conduit 143. Although six cables are shown in each of the first conduit 141 and the second conduit 143, other numbers of one or more cables may be utilized, and the first conduit 141 and the second conduit 143 may include like or different numbers of cables therein. In some examples, bundles of cables or cabling 121 may include different strands or cables that may provide redundancy or otherwise provide connection among different types of connectors. Additionally, although the cabling 121 is shown with cables having two different sizes, any combination of any suitable number of same or different sizes can be utilized.

FIGS. 5 and 6 depict an example of a top view of the tray 125 in which the first conduit 141 and the second conduit 143 are serviced separately from one another. More particularly, FIG. 5 depicts a state in which the first conduit 141 has been removed for servicing separately from the second conduit 143, and FIG. 6 depicts a state in which the second conduit 143 has been removed for servicing separately from the first conduit 141.

In FIG. 5, the second conduit 143 (e.g., outer loop) has been maintained in position during servicing of the first conduit 141 (e.g., inner loop). The first conduit 141 may be removed and/or reinstalled along the path shown by arrow 165, such as by sliding along the conduit structure 139. This may correspond to sliding along the track 157 in FIG. 4, such as along the inner portion 161 of the track 157, for example.

Respective components associated with the first conduit 141 may be detached to facilitate servicing or otherwise reaching the position shown in FIG. 5. For example, referring to FIG. 6, a primary first bracket part 135A may be detached from the appliance 105 and a primary second bracket part 137A may be detached from the tray 125 to release the first conduit 141 for servicing. The primary first bracket part 135A may be a detachable part or other portion of the first bracket 135, and the primary second bracket part 137A may be a detachable part or other portion of the second bracket 137, for example. One or more ends of cabling 121 extending from the first conduit 141 may be disconnected from a corresponding appliance 105 or other component. Once de-constrained, the first conduit 141 may be removed (e.g., moving along the path depicted by arrow 165 in FIG. 5), which may cause an entire length of the cabling 121 to exit with the first conduit 141. Corresponding operations may be performed in reverse order to re-install the first conduit 141, e.g., after repairing, replacing, or otherwise servicing cabling 121 extending therethrough.

In an alternate scenario depicted in FIG. 6, the first conduit 141 (e.g., inner loop) has been maintained in position during servicing of the second conduit 143 (e.g., outer loop). The second conduit 143 may be removed and/or reinstalled along the path shown by arrow 167, such as by sliding along the conduit structure 139. This may correspond to sliding along the track 157 in FIG. 4, such as along the outer portion 163 of the track 157, for example.

Respective components associated with the second conduit 143 may be detached to facilitate servicing or otherwise reaching the position shown in FIG. 6. For example, referring to FIG. 5, a secondary first bracket part 135B may be detached from the appliance 105 and a secondary second bracket part 137B may be detached from the tray 125 to release the second conduit 143 for servicing. The secondary first bracket part 135B may be a detachable part or other portion of the first bracket 135, and the secondary second bracket part 137B may be a detachable part or other portion of the second bracket 137, for example. One or more ends of cabling 121 extending from the second conduit 143 may be disconnected from a corresponding appliance 105 or other component. Once de-constrained, the second conduit 143 may be removed (e.g., moving along the path depicted by arrow 167 in FIG. 6), which may cause an entire length of the cabling 121 to exit with the second conduit 143. Corresponding operations may be performed in reverse order to re-install the second conduit 143, e.g., after repairing, replacing, or otherwise servicing cabling 121 extending therethrough.

The cable guide 133 may enable separate servicing of the first conduit 141 and the second conduit 143 in a manner that differs from the nested arrangement 151. In comparison, the nested arrangement 151 may lack capacity to separately service each of the inwardly nested keeper 153 and the outwardly nested keeper 155 without disconnecting both. For example, with reference to FIG. 5, although the inwardly nested keeper 153 may be readily removed and reinstalled as at arrow 169 without disrupting the connection of the outwardly nested keeper 155, the outwardly nested keeper 155 in FIG. 6 may be unsuitable to remove without first removing the inwardly nested keeper 153 as respectively shown at arrows 169 and 171 in FIG. 6.

Figure 7:
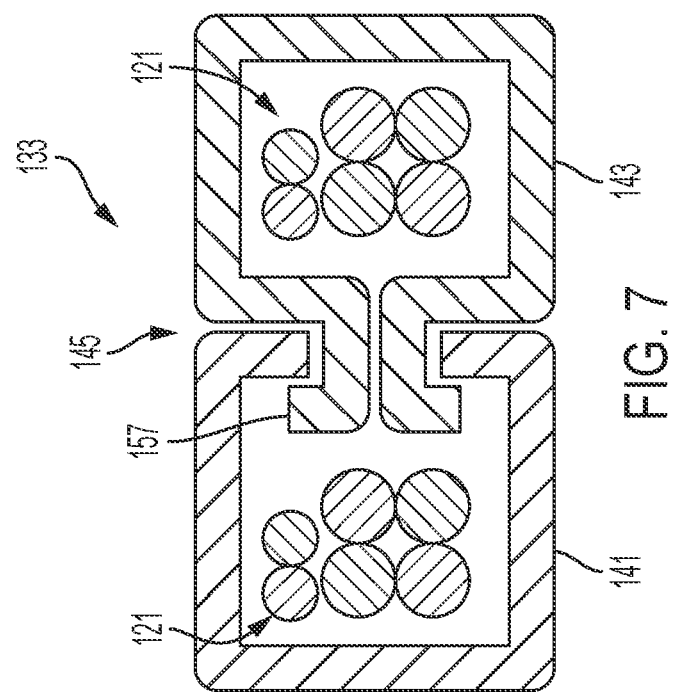
FIG. 7 is an end view of an example of a track structure that may be included in the conduits of the cable guide of FIGS. 2-3 in accordance with various embodiments.

FIG. 7 shows further structure that may be included in the cable guide 133. The juncture 145 may include a track 157 that is formed as a portion of one or the other of the first conduit 141 or the second conduit 143. Track 157 is shown as a trough in which a projecting extension travels although any other sort of sliding interface may be utilized additionally or alternatively for the track 157 in FIG. 7 or FIG. 4. The arrangement in FIG. 7 specifically has the track 157 shown as a portion of the outer conduit 143 that provides a surface on which the inner conduit 141 can slide, although the arrangement may be swapped so that the track 157 or a following surface may be present on the other instead. The track 157 being incorporated as a portion of one or the other of the first conduit 141 or the second conduit 143 may allow the first conduit 141 and the second conduit 143 to be releasably separable from one another along the juncture 145.

Figure 8:
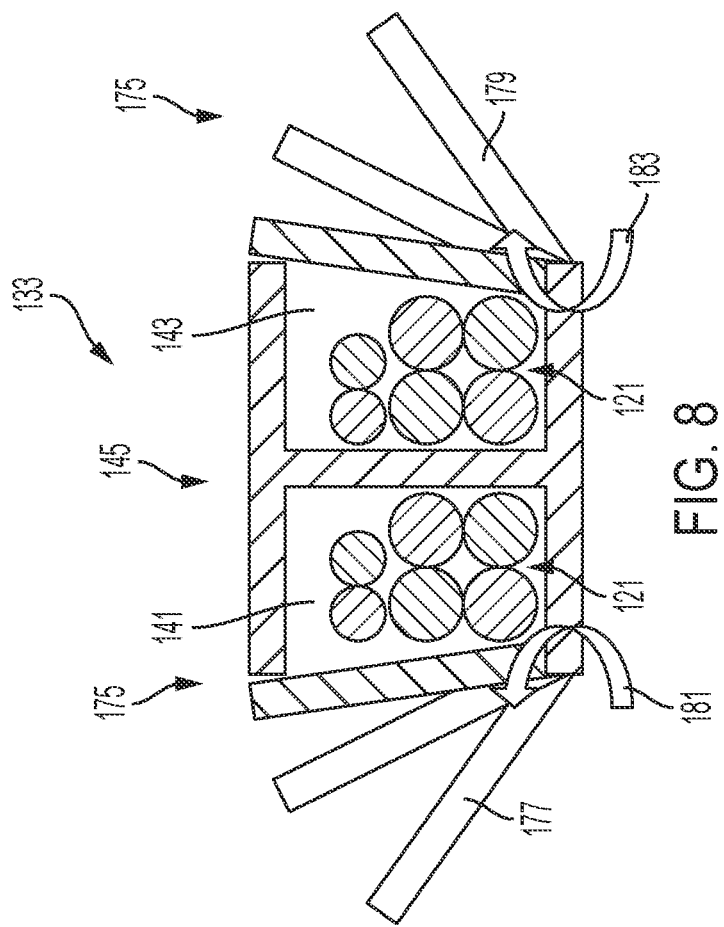
FIG. 8 is an end view of an example of openable sidewalls that may be included in the cable guide of FIGS. 2-3 in accordance with various embodiments.

FIG. 8 illustrates another example of structure that may be included in the cable guide 133. The cable guide 133 can include opposite sidewalls 175. The sidewalls 175 can include a first set 177 and a second set 179. The first set 177 of sidewalls 175 may face away from a first side of the juncture 145. The second set 179 of sidewalls 175 may face away from a second side of the juncture 145.

The first set 177 and second set 179 of sidewalls 175 can be or include doors or other openable structures. The sidewalls 175 can be openable along their length and/or along a length of the cable guide 133 and/or of the first conduit 141 and/or the second conduit 143. The first set 177 of sidewalls 175 may be openable e.g., as illustrated at arrow 181. Opening the first set 177 of sidewalls 175 may provide access to the first conduit 141, e.g., to facilitate access to cabling 121 therein for servicing. The second set 179 of sidewalls 175 may be openable, e.g., as illustrated at arrow 183. Opening the second set 179 of sidewalls 175 may provide access to the second conduit 143, e.g., to facilitate access to cabling 121 therein for servicing. In use, the second set 179 may be or correspond to outwardly facing sidewalls openable to provide access to the second conduit 143 (e.g., an outer loop conduit) while the first set 177 may be or correspond to inwardly facing sidewalls openable to provide access to the first conduit 141 (e.g., an inner loop conduit).

Although the openable sidewalls 175 are shown in FIG. 8 along a solid central juncture 145, other variations are possible. For example, the sidewalls 175 that are openable may be also incorporated into the arrangements in FIGS. 4 and/or 7, and/or a track 157 described with respect to FIGS. 4 and/or 7 may be incorporated into the arrangement shown in FIG. 8. In some aspects, including openable sidewalls 175 as well as a release track 157 may facilitate rapid access for installing, accessing, and/or removing cabling 121 relative to a position within a first conduit 141 or second conduit 143 that has been removed from a track 157 (e.g., permitting cabling to be removed laterally in place of "fishing" or pulling an entire length of the cabling 121 through the removed part of the cable guide 133). However, the track 157 and/or the openable sidewalls 175 can also be used independently and/or may be present regardless of whether the other is present.

Figure 9:
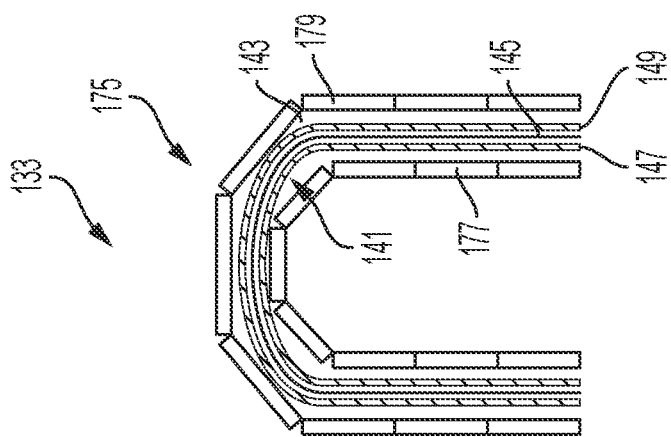
FIG. 9 is a top view of an example in which opposite sets of openable sidewalls of FIG. 8 are each in a closed state in accordance with various embodiments.

FIG. 9 illustrates a top view of an example in which at least a portion of the cable guide 133 has openable sidewalls 175 as described with respect to FIG. 8. The sidewalls 175 may be selectively openable to selectively service the cable guide 133 and/or cabling 121 therein. The sidewalls 175 in FIG. 9 are shown with the first set 177 and the second set 179 both closed in FIG. 9, e.g., such that the first cable 147 is at least partially contained within the first conduit 141 and such that the second cable 149 is at least partially contained within the second conduit 143. For example, the first conduit 141 may have a width or other dimension that extends between the first set 177 of sidewalls 175 and the juncture 145, while the second conduit 143 may have a width or other dimension that extends between the juncture 145 and the second set 179 of sidewalls 175. The sidewalls 175 may extend along a length of the cable guide 133, for example.

Figure 10:
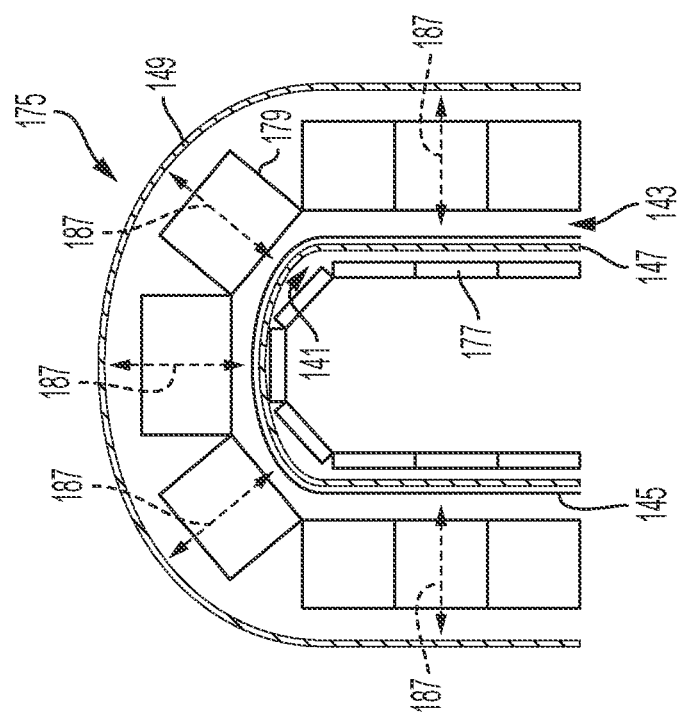
FIG. 10 is a top view of the arrangement of FIG. 9 with outer openable sidewalls in an open state in accordance with various embodiments.

FIG. 10 illustrates an arrangement in which the second set 179 of sidewalls 175 (e.g., outwardly facing sidewalls) have been opened to provide serviceability to the second cable 149. For example, when the second set 179 of sidewalls 175 in an open state, the second cable 149 can be moved outwardly (e.g., such as depicted by arrows 187), which may remove the second cable 149 from the second conduit 143 without disturbing the position and connection of the first cable 147 within the first conduit 141.

Figure 11:
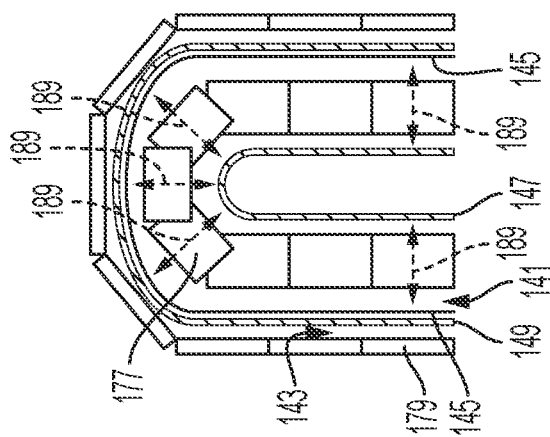
FIG. 11 is a top view of the arrangement of FIG. 9 with inner openable sidewalls in an open state in accordance with various embodiments.

FIG. 11 illustrates an arrangement in which the first set 177 of sidewalls 175 (e.g., inwardly facing sidewalls) have been opened to provide serviceability to the first cable 147. For example, when the first set 177 of sidewalls 175 are in an open state, the first cable 147 can be moved outwardly (e.g., such as depicted by arrows 189), which may remove the first cable 147 from the first conduit 141 without disturbing the position and connection of the second cable 149 within the second conduit 143.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system configured for use in a datacenter, the system comprising:
    a rack;
    a server slidingly received in the rack and movable between an extended position and a retracted position;
    a first storage device received in the server;
    a first cable communicatively coupled with the first storage device;
    a second storage device received in the server;
    a second cable communicatively coupled with the second storage device;
    a tray coupled with the rack and positioned below the server; and
    a cable chain comprising:

a server bracket coupled with an underside of the server along a front of the server;

a tray bracket coupled with a top side of the tray along a front of the tray; and a series of links extending in a U-shape between the server bracket and the tray bracket and moveable in response to movement between the extended position and the retracted position of the server, the series of links defining a conduit structure that includes a juncture, an outer loop conduit, and an inner loop conduit each extending along an entire length of the conduit structure, wherein the inner loop conduit is laterally joined along the juncture to the outer loop conduit so as to extend along one another along the entire length of the conduit structure, wherein the first cable extends through the inner loop conduit without extending through the outer loop conduit, wherein the second cable extends through the outer loop conduit without extending through the inner loop conduit, and wherein the inner loop conduit and the outer loop conduit are separately serviceable by being releasably separable along the juncture.

2. The system of claim 1, wherein:

the first cable is arranged plugged into a front of the server, extending through or over the server bracket, extending through the inner loop conduit, extending through or over the tray bracket, and plugged into a network switch; and the second cable is arranged plugged into the front of the server, extending through or over the server bracket, extending through the outer loop conduit, extending through or over the tray bracket, and plugged into the network switch.

3. The system of claim 1, wherein the inner loop conduit and the outer loop conduit being separately serviceable facilitates selective switching between:

providing access to the first cable without disrupting communication of the second cable with the second storage device; and providing access to the second cable without disrupting communication of the first cable with the first storage device.

4. The system of claim 1, further comprising:

inwardly-facing sidewalls openable to provide access to the inner loop conduit; and outwardly-facing sidewalls openable to provide access to the outer loop conduit.

5. A system comprising a cable guide, the cable guide comprising:

a first bracket configured to be coupled with a reference body, the first bracket comprising a passage for receiving cabling; a second bracket configured to be coupled with a moveable body moveable relative to the reference body, the second bracket comprising another passage for receiving the cabling;

a conduit structure extending between the first bracket and the second bracket, the conduit structure including a first conduit laterally joined along a juncture to a second conduit, wherein the first conduit and the second conduit are coupled together so that the second conduit is arranged as an outer loop and the first conduit is arranged as an inner loop, wherein the inner loop comprises a shorter length than the outer loop and is inward of a u-shaped periphery defined by the outer loop, wherein the first conduit and the second conduit are separately serviceable by being at least one of releasably separable along the juncture or separately openable along opposite sidewalls of the conduit structure.

6. The system of claim 5, wherein the juncture includes a track along which at least one of the first conduit or the second conduit is slidable.

7. The system of claim 6, wherein the juncture includes a base supporting an inner portion of the track and an outer portion of the track, wherein the first conduit is slidable along the inner portion of the track, and wherein the second conduit is slidable along the outer portion of the track.

8. The system of claim 6, wherein the track is formed as a portion of one of the first conduit or the second conduit and arranged to facilitate sliding of the other thereon.

9. The system of claim 5, wherein the first conduit and the second conduit are separately serviceable by being separately openable along opposite sidewalls of the conduit structure, and wherein the opposite sidewalls comprise:

a first set of sidewalls facing away from a first side of the juncture and openable to provide access to the first conduit; and a second set of sidewalls facing away from a second side of the juncture and openable to provide access to the second conduit.

10. The system of claim 5, wherein the moveable body comprises a chassis, and wherein the reference body comprises a tray.

11. The system of claim 10, the system further comprising:

a rack;

a server comprising the chassis, the chassis being slidingly received in the rack and movable between an extended position and a retracted position;

a first storage device received in the server;

a first cable communicatively coupled with the first storage device;

a second storage device received in the server;

a second cable communicatively coupled with the second storage device, wherein the tray is coupled with the rack and positioned below the server; and a cable chain comprising:

a server bracket comprising the second bracket and coupled with an underside of the server along a front of the server;

a tray bracket comprising the first bracket and coupled with a top side of the tray along a front of the tray; and a series of links extending in a U-shape between the server bracket and the tray bracket and moveable in response to movement between the extended position and the retracted position of the server, the series of links defining the conduit structure, wherein the first conduit comprises an inner loop conduit, wherein the second conduit comprises an outer loop conduit, wherein the first cable extends through the inner loop conduit without extending through the outer loop conduit, wherein the second cable extends through the outer loop conduit without extending through the inner loop conduit, and wherein the inner loop conduit and the outer loop conduit are separately serviceable by being releasably separable along the juncture.

* * * * *